United States Patent [19]

Ham

[11] 4,103,228
[45] Jul. 25, 1978

[54] METHOD FOR DETERMINING WHETHER HOLES IN DIELECTRIC LAYERS ARE OPENED

[75] Inventor: William Edward Ham, Mercerville, N.J.

[73] Assignee: RCA Corp., New York, N.Y.

[21] Appl. No.: 797,401

[22] Filed: May 16, 1977

[51] Int. Cl.² ............................................. G01R 27/02
[52] U.S. Cl. ..................................... 324/65 R; 324/51; 324/62; 324/158 P
[58] Field of Search .................... 324/65 R, 62, 64, 51, 324/158 F, 158 P

[56] References Cited

U.S. PATENT DOCUMENTS

| | | | |
|---|---|---|---|
| 3,735,253 | 5/1973 | Seger | 324/64 |
| 3,794,912 | 2/1974 | Severin et al. | 324/62 |
| 3,803,485 | 4/1974 | Crites et al. | 324/65 R |
| 3,803,489 | 4/1974 | Miller | 324/158 P X |
| 4,021,735 | 5/1977 | Gutberlet et al. | 324/158 P |

OTHER PUBLICATIONS

Koens, Micromanipulator Liquid Contact Tester Probe, IBM Technical Disclosure Bulletin, Jun. 1972, p. 344.

*Primary Examiner*—Stanley T. Krawczewicz
*Attorney, Agent, or Firm*—H. Christoffersen; Sanford J. Asman

[57] ABSTRACT

The method is used to determine whether holes etched into a dielectric layer which has been formed on a surface of a semiconductor wafer are open. A plurality of specimen holes are formed in a selected portion of the wafer simultaneously with the formation of the holes to be tested. The specimen holes are then contacted with an electrolytic probe, and the wafer is contacted with an output probe. The resistance, through the wafer, between the electrolytic probe and the output probe is determined. Since the resistance is related to the amount of dielectric material remaining in the hole, a non-destructive determination may be made as to whether the device should be subjected to additional etching.

7 Claims, 4 Drawing Figures

METHOD FOR DETERMINING WHETHER HOLES IN DIELECTRIC LAYERS ARE OPENED

The invention relates to a method of testing dielectrically coated semiconductor wafers during the fabrication of semiconductor devices and integrated circuits, and more particularly, it relates to a method of testing semiconductor wafers to determine the extent to which openings in dielectric coatings formed on the surface of the wafer have been etched.

In the manufacture of semiconductor devices it frequently becomes necessary to etch holes in dielectric coatings which have been formed on the surface of the wafer. Frequently, it occurs that these holes are not completely opened by the etchant. In holes of very small diameter, visual inspection is not sufficient to determine whether the holes are completely open. Thus, when a metallization pattern is applied to the surface of a wafer which has holes which are not opened, ohmic contact to the surface of the semiconductor through the holes is prevented by the presence of the dielectric material therein. When that occurs, an entire wafer may be wasted, thus greatly decreasing the overall yield.

In the past, non-destructive tests have been proposed to ascertain the extent to which holes have been opened by an etching operation. One such test, is disclosed in U.S. Pat. No. 3,851,245. The method described therein requires that a defined conductive layer be deposited over the dielectrically coated surface of a semiconductor wafer and into the holes. A voltage is applied to the layer, and the extent to which the holes have been opened is determined by a resistance measurement. The defined conductive layer is subsequently removed by etching and the final metallization pattern is applied if the holes are open. This method if expensive because an additional photolithographic step is added to the fabrication process in order to define the conductive layer. Further, the utility of the process is limited when the holes being tested have very small diameters.

Another proposed solution has been to carry out a resistance measurement test similar to the one described in the patent identified above by inserting a removable probe, rather than a deposited probe, into the hole. This method does not require an additional photolithographic step. However, when used with holes of very small diameter, it is difficult to fabricate probes of the required size. Further, the removable probe may pierce any dielectric material which may remain in the holes, thus giving a reading which would indicate that the hole is open when, in fact, it is not. As a result, the device may not be subjected to additional etching even though such etching may be required.

It would be desirable to develop a non-destructive testing method which would accurately determine the extent to which holes have been opened by an etching operation which has been performed on a semiconductor wafer, which method does not require any additional photolithographic steps and which is applicable to wafers having small dimensioned holes.

Figure 1:
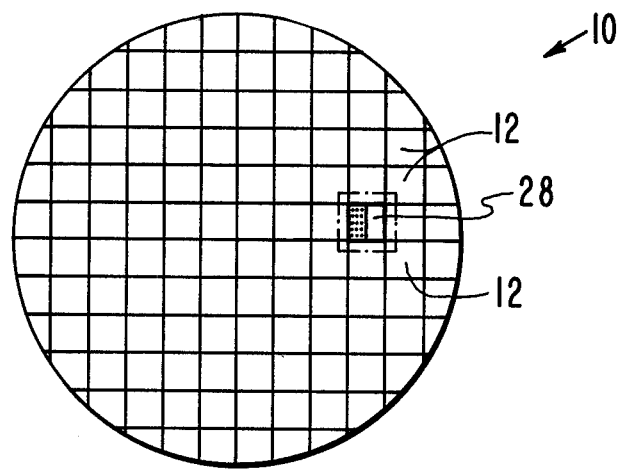
FIG. 1 represents a top view of a wafer of semiconductor material which is to be tested in accordance with the method of the present invention.

Referring now to FIG. 1, a wafer 10 of semiconductor material is shown. The wafer 10 is typically formed of silicon. However, the present method has application to wafers formed of any semiconductor material. Further, the present method is applicable to silicon wafers which have been epitaxially grown on sapphire substrates.

Figure 2:
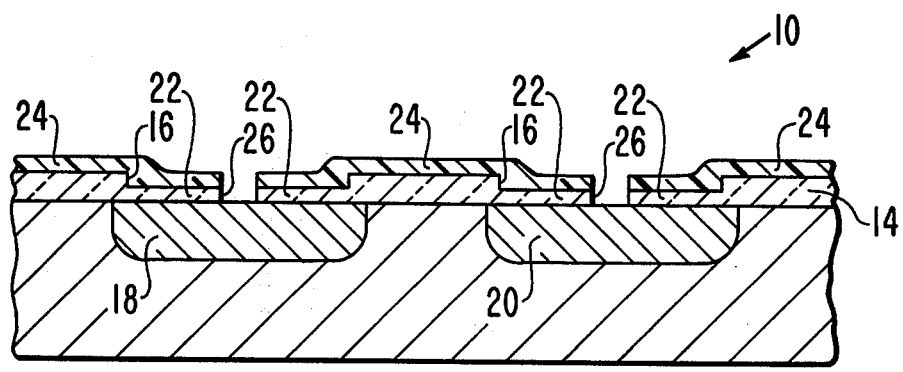
FIG. 2 is a cross-sectional view of a portion of the wafer shown in FIG. 1 during an intermediate stage in the fabrication of a completed semiconductor device.

The wafer 10, prior to being tested, is subjected to a variety of standard processing steps. For example, the wafer is typically divided into a plurality of regions 12 which eventually will comprise separate semiconductor devices. As shown in FIG. 2, in the fabrication of a typical semiconductor device, a dielectric layer 14 is typically provided on the surface of the wafer 10. If the wafer 10 is silicon, the dielectric layer 14 is generally silicon dioxide formed by either thermal oxidation or pyrolysis. Other dielectric materials are commonly used, such as silicon nitride, and the invention is not limited to use with silicon dioxide dielectrics. Openings 16 are then usually provided in the dielectric layer 14 using a photoresist layer and a photomask (not shown) and an etching operation. Through these openings 16, dopants are introduced into the underlying semiconductor material, e.g., by diffusion or ion implantation and regions 18 and 20 of different conductivities than the original wafer 10 are provided in order to fabricate semiconductor devices in each of the regions 12. Next, after this doping step, a new dielectric layer 22 is provide in the openings 16. The wafer is then masked using a standard photoresist layer 24 and contact metallization openings 26 are defined by a photomask (not shown) and then provided by etching.

In a standard processing sequence, i.e. one which does not incorporate a testing procedure to determine whether the openings 26 fully communicate with the semiconductor wafer 10, the photoresist layer 24 is removed and a metallization pattern is defined to provide ohmic contact to the regions 18 and 20. However, as mentioned above, if it should happen that the holes 26 have not been completely opened through the dielectric layer 22, ohmic contact will not be achieved and the devices formed may be inoperative. In many processes, it is impossible to remove the metallization for further etching without destroying the wafer. In processes in which the metallization can be removed, such removal and reprocessing is very expensive because of the photoresist steps involved. To eliminate this problem, the present invention contemplates using one of said regions 12 as a location for carrying out a non-destructive test to determine whether holes formed in the dielectric layer 22 are open before the metallization step is accomplished.

Figure 3:
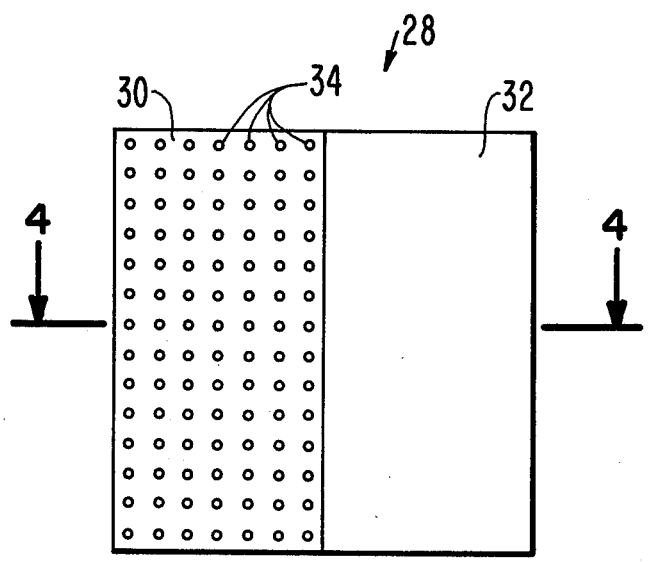
FIG. 3 is a top view of a different portion of the wafer shown in FIG. 1, which portion serves as a test region upon which the present invention is carried out.

In this regard, a test region 28, as shown in FIG. 1, of the wafer 10 is chosen. Referring to FIG. 3, the test region 28 is preferably divided into a first portion 30 and a second portion 32. Then, simultaneously with the formation of the openings 26 in the dielectric layer 22 at each of the regions 12, a plurality of specimen holes 34 are etched into the dielectric layer 26 in the first portion 30. The present invention could be carried out with only a single specimen hole 34. However, a plurality of specimen holes 34 are preferred for the reasons set forth below. The specimen holes 34 should be formed to have a diameter equal to that of the smallest contact hole 26 required in each of the regions 12 and the specimen holes 34 should be spaced sufficiently far apart to prevent their overlap. In one typical example, about 2500 holes have been formed having a diameter of about $2.5 \times 10^{-4}$ /cm and spaced apart about $5 \times 10^{-4}$ /cm center-to-center. However, the invention may be carried out with considerably fewer holes, and acceptable results have been obtained using 100 holes.

Figure 4:
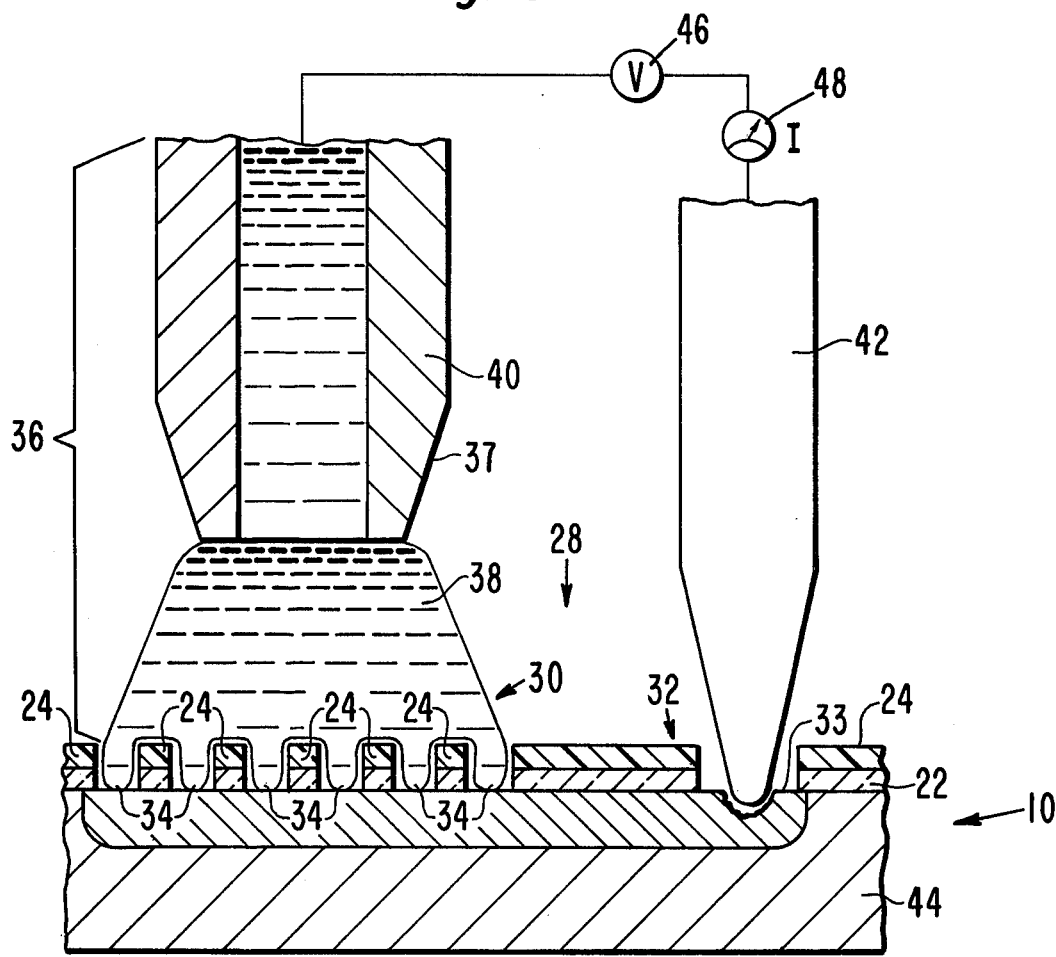
FIG. 4 is a cross-sectional view of the test region shown in FIG. 3 upon which the present method is being practiced.

Next, as shown in FIG. 4, without removing the photoresist layer 24 from the wafer, the first portion 30 of the test region 28 is contacted with an electrolytic input probe 36. In the preferred embodiment, this electrolytic input probe may be comprised of a bead 38 of liquid electrolyte which is suspended from a capillary tube 40. In a practical example, the tube may be formed of stainless steel or other conductive material, such as platinum. The tube 40 may be formed for example, to have an outside diameter of approximately $2.5 \times 10^{-2}$ cm and an inside diameter of about $1.25 \times 10^{-2}$ cm. The tube 36 may have a bevelled end 37 as shown. Using a tube of this size, the bead 38 will be formed to a diameter of approximately $1.9 \times 10^{-2}$ cm. The electrolyte chosen should be one which does not react with the photoresist layer 24 and which does not contain materials which might contaminate the wafer 10 or react with the dielectric. In one practical example, such an electrolyte is deionized water.

As may be seen from FIG. 4, the bead of electrolyte 38 flows into the specimen holes 34 and contacts the wafer 10 if the holes are completely open. To determine whether the specimen holes 34 are completely open, an output probe 42 is contacted to the wafer 10. The output probe 42 may be a metal probe as shown which contacts the wafer through a large contact hole 33. Alternatively, the output probe 42 may be an electrolytic probe similar to that used for the input probe 36 or may be a metal probe which contacts the wafer by scratching through the photoresist layer 24 and the dielectric layer 22 to contact the underlying wafer 10. A voltage is applied between the electrolytic input probe 36 and the output probe 42 from a voltage supply 46, and the current flowing between the input probe 36 and the output probe 42 is measured by the ammeter 48. Either an AC or DC voltage may be used. However, use of a DC voltage for an extended period of time may either anodize or electrolytically etch the dielectric thereby affecting the measured current. Since the current passing between the input probe 36 and the output probe 42 is proportional to the area of opened specimen holes 34 once the dielectric layer has been pierced, but is dependent upon the dielectric layer until it has been pierced, it may be easily determined whether the holes 34 have been opened. While it would be possible to carry out the present method with a single specimen hole 34, it is preferred that a plurality of holes 34 be used in order that the resistance between the input probe 36 and the output probe 42 may be determined at higher current levels thus allowing the use of more accurate measurement instruments.

The output probe 42 may contact the second portion 32 of the test region 28. However, it would be possible for the output probe 42 to contact the back surface 44 of the wafer 10, provided that if the back surface 44 is separated from the first portion 30 by a PN junction the proper polarity is observed.

The present invention is advantageous in that if it should be determined that the holes 34, and consequently the holes 26, are not fully opened, the device may be subjected to additional etchings without further masking since the photoresist layer 24 is still intact.

It should be pointed out that the invention operates effectively because the dielectric presents the predominant resistance to the flow of current in the system. Once the holes are opened, i.e. the dielectric is punctured, the combination of the hole size and electrolyte within the holes determine the measured resistance, which will be much lower than the resistance presented by the dielectric. As the size of the holes increases, the resistance will decrease until the holes are so large or numerous that the resistance is determined by the bulk of the electrolyte. The distance of the input probe from the output probe on the wafer is insignificant, because the holes are formed over highly conductive portions of the wafer. Accordingly, the wafer's resistance is not significant when measured in series with the resistances discussed above.

What is claimed is:

1. A method of determining whether holes formed in a dielectric layer on a surface of a semiconductor wafer are open to communicate with said surface comprising the steps of:
   (a) selecting a portion of said dielectric layer for a test area;
   (b) forming at least one specimen hole in said dielectric layer within said test area;
   (c) electrically contacting said wafer through said specimen hole with an electrolytic input probe;
   (d) electrically contacting said wafer with an output probe;
   (e) applying a voltage between said input probe and said output probe; and
   (f) measuring the current flow between said input probe and said output probe to determine whether any dielectric remains between said input probe and said surface.

2. The method of claim 1, wherein the step of contacting said wafer with said electrolytic input probe comprises suspending a bead of electrolyte from a capillary tube and contacting said bead to said wafer through said specimen hole.

3. The method of claim 2, wherein said electrolyte comprises deionized water.

4. The method of claim 1, wherein said step of contacting said wafer with said output probe comprises contacting a second portion of said wafer with said output probe.

5. The method of claim 4, wherein said test area is adjacent said second portion of said wafer, but said output probe is displaced from said electrolyte.

6. The method of claim 4 wherein said test area is on the upper side of said wafer and said second portion of said wafer is on the underside of said wafer.

7. The method of claim 1 further comprising the step of etching said dielectric layer until no dielectric remains between said input probe and said surface.

* * * * *